(12) United States Patent
Rupp et al.

(10) Patent No.: US 6,857,110 B1
(45) Date of Patent: Feb. 15, 2005

(54) DESIGN METHODOLOGY FOR MERGING PROGRAMMABLE LOGIC INTO A CUSTOM IC

(75) Inventors: Charle' R. Rupp, Morgan Hill, CA (US); Timothy L. Garverick, Los Altos Hills, CA (US); Jeffrey Arnold, San Diego, CA (US)

(73) Assignee: Stretch, Inc., Mountain View, CA (US)

( * ) Notice: Subject to any disclaimer, the term of this patent is extended or adjusted under 35 U.S.C. 154(b) by 0 days.

(21) Appl. No.: 10/067,151

(22) Filed: Jan. 29, 2002

Related U.S. Application Data

(60) Provisional application No. 60/265,303, filed on Jan. 30, 2001.

(51) Int. Cl.[7] .............................................. G06F 17/50
(52) U.S. Cl. ..................... 716/4; 716/2; 716/6; 716/17; 326/44
(58) Field of Search ................................ 326/44; 716/2, 716/4, 6, 17, 16, 18; 712/228, 43; 714/724; 713/600

(56) References Cited

U.S. PATENT DOCUMENTS

| | | | |
|---|---|---|---|
| 5,300,831 A | * | 4/1994 | Pham et al. ................... 326/44 |
| 5,426,744 A | * | 6/1995 | Sawase et al. ............... 712/228 |
| 5,727,173 A | | 3/1998 | Rupp |
| 5,784,636 A | | 7/1998 | Rupp |
| 5,991,907 A | | 11/1999 | Stroud et al. |
| 6,044,481 A | * | 3/2000 | Kornachuk et al. .......... 714/724 |
| 6,052,773 A | * | 4/2000 | DeHon et al. ................. 712/43 |
| 6,260,182 B1 | | 7/2001 | Mohan et al. |
| 6,282,633 B1 | | 8/2001 | Killian et al. |
| 6,292,388 B1 | | 9/2001 | Camarota |
| 6,377,912 B1 | * | 4/2002 | Sample et al. .................. 716/1 |
| 6,418,045 B2 | | 7/2002 | Camarota |
| 6,426,648 B1 | | 7/2002 | Rupp |
| 6,477,683 B1 | | 11/2002 | Killian et al. |
| 6,477,697 B1 | | 11/2002 | Killian et al. |
| 6,550,042 B1 | * | 4/2003 | Dave .............................. 716/5 |
| 2001/0047509 A1 | * | 11/2001 | Mason et al. ................. 716/18 |
| 2001/0049816 A1 | | 12/2001 | Rupp |

OTHER PUBLICATIONS

U.S. patent application Ser. No. 09/475,400, Rupp, Multi-Scale Programmable Array, filed Dec. 30, 1999.
U.S. patent application Ser. No. 09/883,976, Rupp, Multi-Scale Programmable Array, filed Jun. 19, 2001.
John Hesketh, "The Programmable Logic Core: Enabling the configurable System–On–a–Chip", Technical Presentation by LSI Logic Corporation, presented Jan. 30, 2001 in US.
John Hesketh, "The Programmable Logic Core: Enabling the configurable System–On–a–Chip", Technical Presentation by LSI Logic Corporation, presented Jan. 30, 2001in US.

* cited by examiner

*Primary Examiner*—Thuan Do
(74) *Attorney, Agent, or Firm*—Carr & Ferrell LLP

(57) ABSTRACT

A programmable logic core (PLC) can be integrated into custom ICs such as ASICs and SOCs using a unique design methodology. For example, the methodology can incorporate the PLC into the entire ASIC design process from chip level RTL to final tape-out and resolve issues ranging from RTL guidelines through to sub-micron signal integrity. The post-manufacture programming flow is considered up-front during the ASIC flow and tools ensure successful programming in the field environment for the lifetime of the product. An example PLC architecture for integration into a custom IC includes a Multi Scale Array (MSA) that consists of an array of configurable ALUs and is implemented as a hard macro, an Application Circuit Interface (ACI) that provides signal interface between the MSA and application circuitry and is included in the same hard macro, and a PLC Adapter that initiates and loads the PLC configuration data and interfaces that is implemented as a soft-macro.

13 Claims, 12 Drawing Sheets

DESIGN METHODOLOGY FOR MERGING PROGRAMMABLE LOGIC INTO A CUSTOM IC

CROSS-REFERENCE TO RELATED APPLICATIONS

The present application is based on, and claims priority from, U.S. Appln. No. 60/265,303, filed Jan. 30, 2001, the contents of which are incorporated herein by reference.

FIELD OF THE INVENTION

The present invention relates to programmable logic elements, and in particular, to techniques for merging programmable logic cores into customized integrated circuits such as ASICs and SOCs.

DESCRIPTION OF THE RELATED ART

Co-pending U.S. application Ser. No. 09/475,400 dramatically advances the state of the art by introducing the concept of the "Multi-Scale Array" (MSA). Programmable Logic Cores (PLCs) based on this high-speed configurable logic structure enable the development of a new class of complex cell-based ASICs and configurable SOCS. SOC/ASIC designs incorporating these PLCs offer the best of both FPGA and ASIC worlds by combining the flexibility of FPGAs with the price and performance advantages of cell based ASICs.

It would be desirable if a methodology could be developed to incorporate the PLC design into overall ASIC design processes.

SUMMARY OF THE INVENTION

A programmable logic core (PLC) can be integrated into custom ICs such as ASICs and SOCs using a unique design methodology. For example, the methodology can incorporate the PLC into the entire ASIC design process from chip level RTL to final tape-out and resolve issues ranging from RTL guidelines through to sub-micron signal integrity. The post-manufacture programming flow is considered up-front during the ASIC flow and tools ensure successful programming in the field environment for the lifetime of the product. An example PLC architecture for integration into a custom IC includes a Multi Scale Array (MSA) that consists of an array of configurable ALUs and is implemented as a hard macro, an Application Circuit Interface (ACI) that provides signal interface between the MSA and application circuitry and is included in the same hard macro, and a PLC Adapter that initiates and loads the PLC configuration data and interfaces that is implemented as a soft-macro.

BRIEF DESCRIPTION OF THE DRAWINGS

These and other objects and advantages of the present invention will become apparent to those skilled in the art after considering the following detailed specification, together with the accompanying drawings wherein.

DETAILED DESCRIPTION OF THE PREFERRED EMBODIMENTS

The attached Appendix forms part of this disclosure and is fully incorporated herein by reference.

Figure 1:
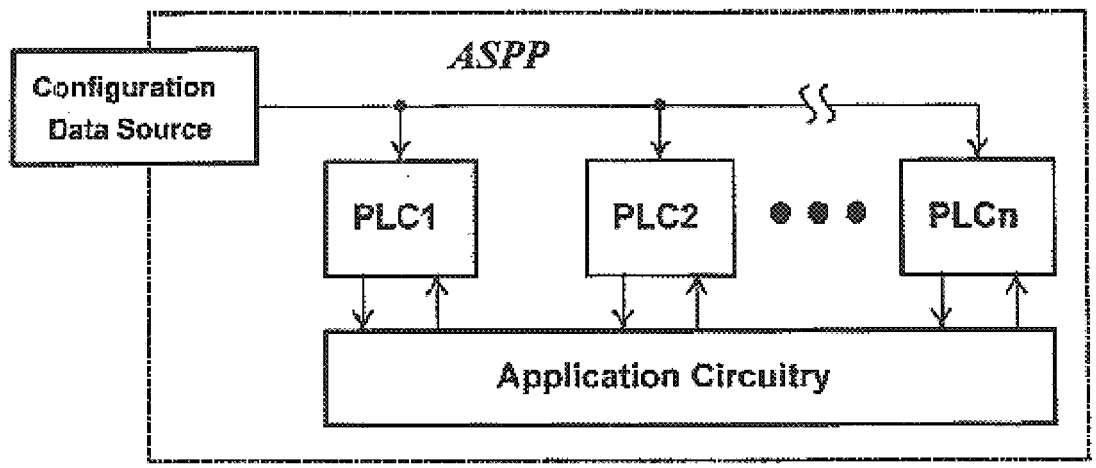
FIG. 1 illustrates the use of one or more PLC blocks in an ASIC product in accordance with an aspect of the invention.

As used herein, the Programmable Logic Core (PLC) is a building block for the development of complex, cell-based Application Specific Integrated Circuits (ASICs). As illustrated in FIG. 1, the use of one or more PLC blocks in an ASIC product allows the customer to modify the functional behavior of a portion of the ASIC at any time during or after the deployment of the end product. The gate capacity and detailed interface may be varied for each PLC Core to meet the needs of the target product. The configuration data that defines a specific behavior of a PLC Core is loaded into CMOS storage elements in the PLC from a configuration data source. The configuration data source is typically an on-chip ROM or an off chip programmable ROM. ASIC components that combine cell-based logic with PLCs are referred to as Application Specific Programmable Products (ASPPs).

Figure 2:
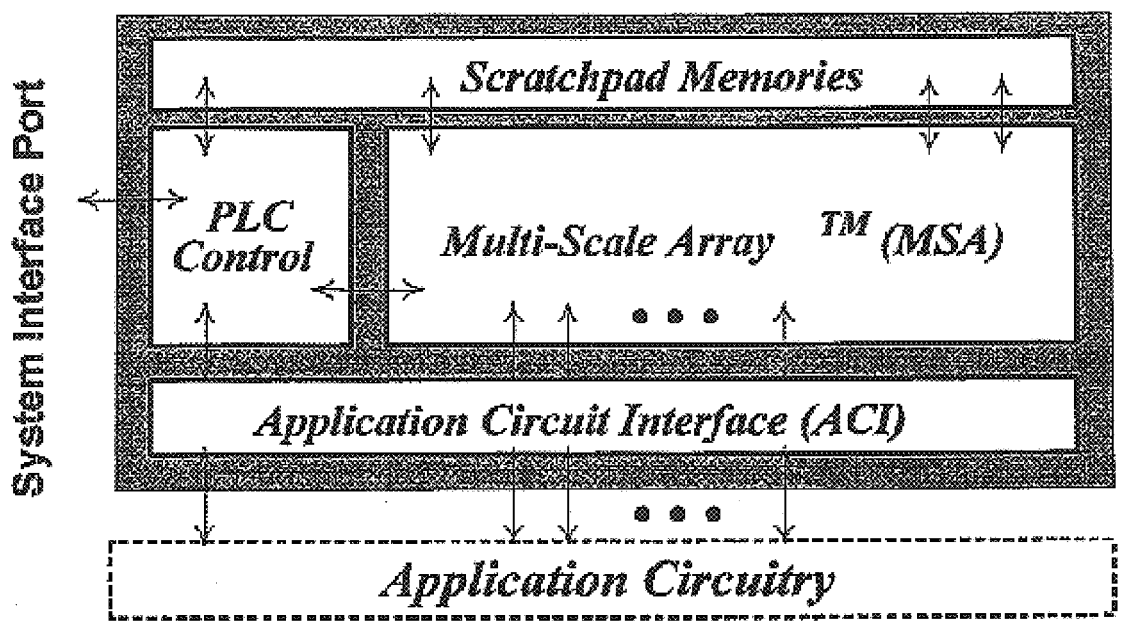
FIG. 2 illustrates a PLC based on an array of Configurable Arithmetic Logic Units (CALUs) called the Multi-Scale Array (MSA)

The Programmable Logic Core (PLC) is a very high density, high-speed configurable logic structure for use in the development of ASIC components. As illustrated in FIG. 2, the PLC is based on an array of Configurable Arithmetic Logic Units (CALUs) called the MultiScale Array (MSA). This structure directly supports functions of different scales, such as Register Transfer Level (RTL) functions (e.g., counters and adders) as well as complex state machine and random logic structures. Scratchpad memory blocks may be incorporated into a specific PLC Core to supplement the internal register storage capabilities of the MSA for datapath intensive applications. The Application Circuit Interface (ACI) provides the signal interface between the MSA programmable routing resources and the application circuitry. The ACI is optimized for each PLC Core and includes scan test registers which allow effective testing of the PLC independent of the application specific circuits, testing of the application specific circuits independent of the PLC and concurrent testing of the combined PLC and application specific circuit behavior. The PLC Control block provides control mechanisms for loading configuration data into the MSA, controlling the application clock and reset signals and for testing the PLC blocks.

The MSA can be implemented, for example, by the techniques disclosed in co-pending U.S. Appln. Ser. No. 09/475,400, commonly owned by the assignee of the present invention, the contents of which are incorporated fully herein by reference. Although an MSA based on the principles of the co-pending application is considered preferable, the present invention is not limited thereto, and those skilled in the art will be able to understand how to extend the principles of the invention to other types of programmable logic structures after being taught by the present disclosure.

Figure 3:
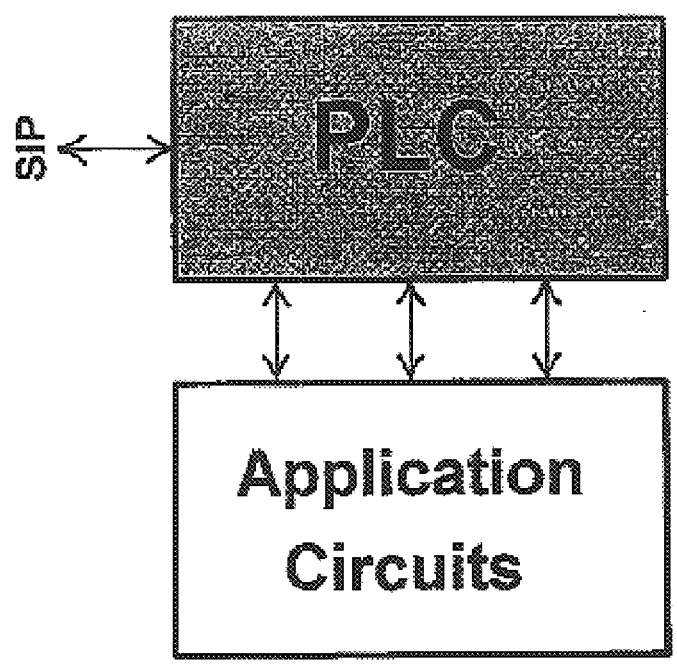
FIG. 3 illustrates the Reconfigurable Gate Array (RGA) PLC usage model of the present invention.

There are two basic usage models of a PLC and many variations of these models. The simplest usage model is illustrated in FIG. 3 and is called the Reconfigurable Gate Array (RGA) model. In this model, the PLC uses a serial interface for the configuration data and test interface (the System Interface Port). The normal data and control flow in this model is accomplished primarily through the application circuit interface.

Figure 4:
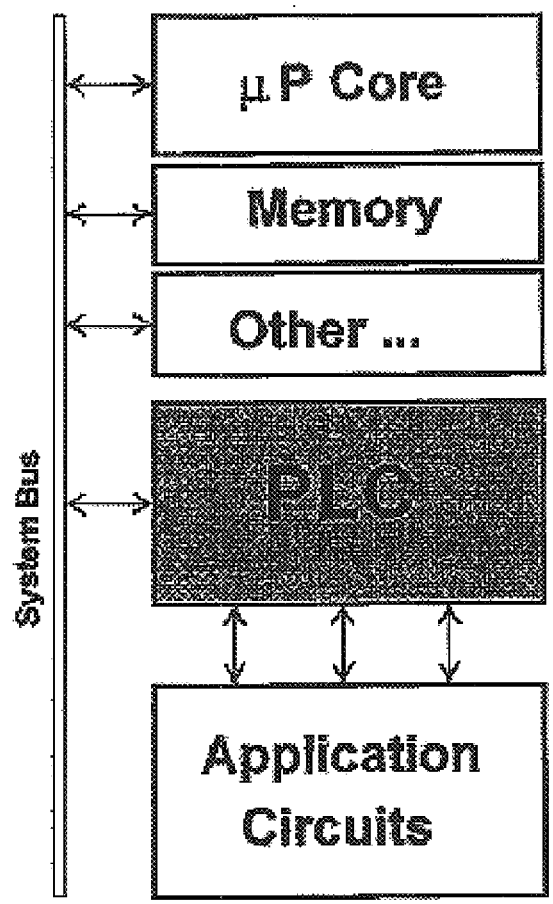
FIG. 4 illustrates a coprocessor model PLC usage model of the present invention.

The PLC technology can also be used to implement a coprocessor model. In this alternative style, a parallel bus System Interface Port is used to allow direct communication of a PLC with a microprocessor core and associated memory and peripheral devices. As illustrated in FIG. 4, this style of usage allows data streaming directly between system memory and the PLC, which is useful for computation intensive applications of the PLC. The coprocessor model requires specialized application software to take full advantage of the parallel processing capabilities.

Figure 5:
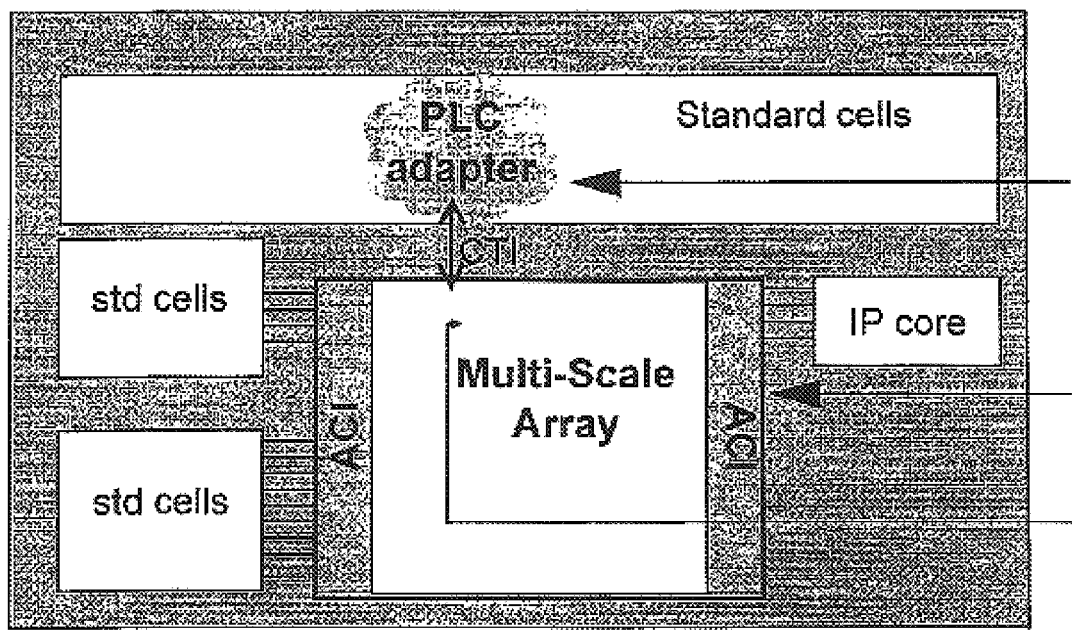
FIG. 5 illustrates an example implementation of a PLC integrated in an ASIC, which are together called the ASPP, according to the invention.

FIG. 5 illustrates an example implementation of a PLC integrated in an ASIC, which are together called the ASPP. The Multi-Scale Array (MSA) and the application circuit interface (ACI) together make up the PLC Hard Macro. The ACI provides the signal interface between the MSA programmable routing resources and the application circuitry. The ACI includes scan test registers for testing the PLC and application-specific circuits independently and concurrently.

Preferably, the PLC adapter is delivered as synthesizable HDL and may be merged with the application-specific circuitry outside of the PLC hard macro. The PLC adapter initiates and loads the PLC configuration data and interfaces to test circuitry, clock, and reset control through the Configuration Test Interface (CTI).

The PLC directly supports register transfer level (RTL) functions such as counters and adders as well as complex state machine and random logic structures. A PLC is typically used to augment application circuitry (including cell-based blocks, SRAM blocks and other core blocks), and to provide programmable control and datapath capabilities for field enhancement of the ASIC device.

As shown in FIG. 5, the PLC adapter, the MSA, and the ACI together make up a PLC. The PLC adapter is a soft macro. The MSA and ACI together make up the PLC hard macro. The CTI provides communication between the adapter and the PLC hard macro.

A specific PLC is created according to a set of user's parameters that define the size of the logic array, the type of system interface, the details of the application circuit interfaces, and selection of a PLC adapter. A PLC is integrated using standard ASIC development tools. The behavior of a PLC is controlled by the PLC program. The PLC program is developed using standard ASIC development tools in conjunction with automated place and route tools.

Configuration data is derived from the PLC program, then sent through a configuration data source to the PLC adapter. The PLC adapter loads the configuration data into a set of configuration data registers in the MSA, collectively referred to as the configuration memory, and tests the PLC internal logic, clock and reset control, and run time interface extensions.

In one example of the invention, a PLC is delivered as a PLC hard macro and a soft macro (the PLC adapter). Each PLC is designed to be incorporated into products developed with a given ASIC design flow. PLCs are manufactured by the customer, along with the rest of the ASPP, using the customer's foundry. Preferably, each PLC instance uses at least four metal layers with the provision for a limited number of feedthrough connections provided as "spare ports" in the design.

Figure 6:
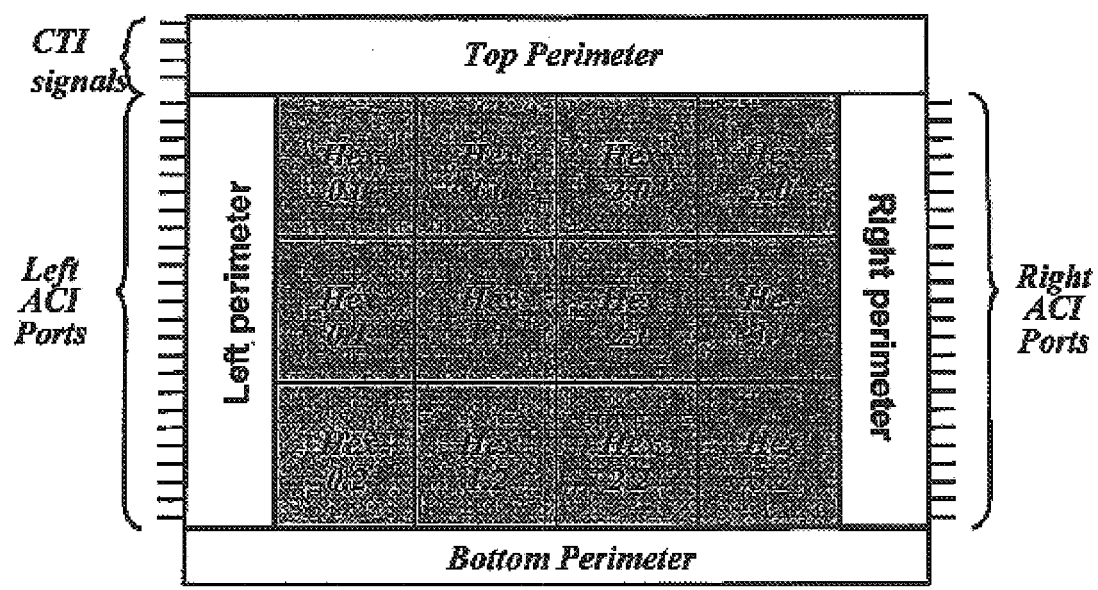
FIG. 6 illustrates the floorplan for a typical PLC hard macro in accordance with the principles of the invention.

FIG. 6 illustrates the floorplan for a typical PLC hard macro. The MSA, shown in the figure as an array of hex-blocks, uses most of the area. The hex-block design can be identical for all products in a PLC family. The MSA is surrounded by a perimeter of four blocks. The size of the perimeter blocks shown in FIG. 6 is exaggerated for discussion purposes.

The bottom perimeter block is used to properly terminate the signals on the bottom edge of the MSA, so it normally has no external signal interfaces. The bottom perimeter block is usually very small and the design varies only by the width of the MSA. The left and right perimeter blocks include configuration data control logic, scan-path logic, and the ACI logic. The ACI ports can be specified in the PLC specification to use one side or both sides. In one example, the left and right perimeter blocks are the width of about one quarter (¼) of a hex block. The top perimeter block includes the CTI control circuitry. The top block is typically a fraction of the height of a hex-block.

The behavior of a PLC is controlled by the PLC program, which is developed using standard ASIC development tools in conjunction with automated place and route tools. From the program, the configuration. data is derived and then loaded into the PLC through an on-chip microprocessor bus, an on-chip ROM, or an off chip ROM. The data first goes through the PLC adapter, which is application-specific and embedded in the ASIC's logic. The user selects the interface between the PLC adapter and the application-specific circuitry. For example, the interface could be a serial interface to external pins or a parallel interface to an internal system bus, or a combination of both. After testing the data, the adapter sends it to a set of configuration data registers in the MSA called the configuration memory, so called because the process is similar to reading and writing SRAM blocks.

During the development of an ASPP, the designer interacts with the PLC technology in two fundamental ways. During the ASIC design process, the PLC appears as an intellectual property core to be integrated into the ASPP device. The ASIC integration flow will be described in more detail below. Both during the design process and after product deployment, the PLC appears as a programmable component with its own programming design flow.

Figure 7:
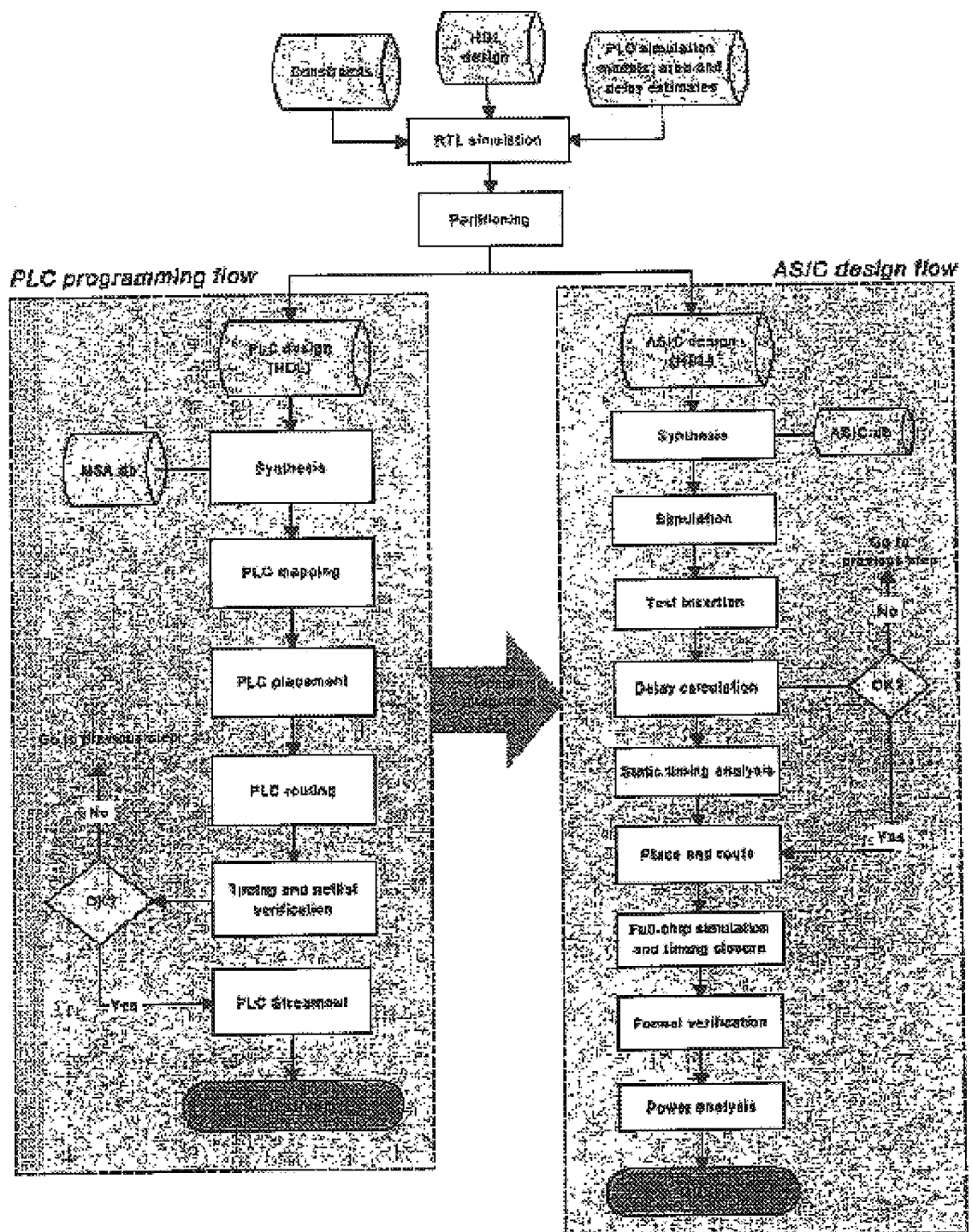
FIG. 7 illustrates examples of the PLC programming flow and an ASIC design flow in accordance with the principles of the invention.

FIG. 7 illustrates examples of the PLC programming flow and an ASIC design flow in accordance with the principles of the invention. The flows occur initially in parallel, but the programming flow can generate PLC programs anytime. The output of the programming flow is the PLC program, written out as a configuration data file. The ASIC flow takes input from the PLC flow throughout the design process.

Figure 8:
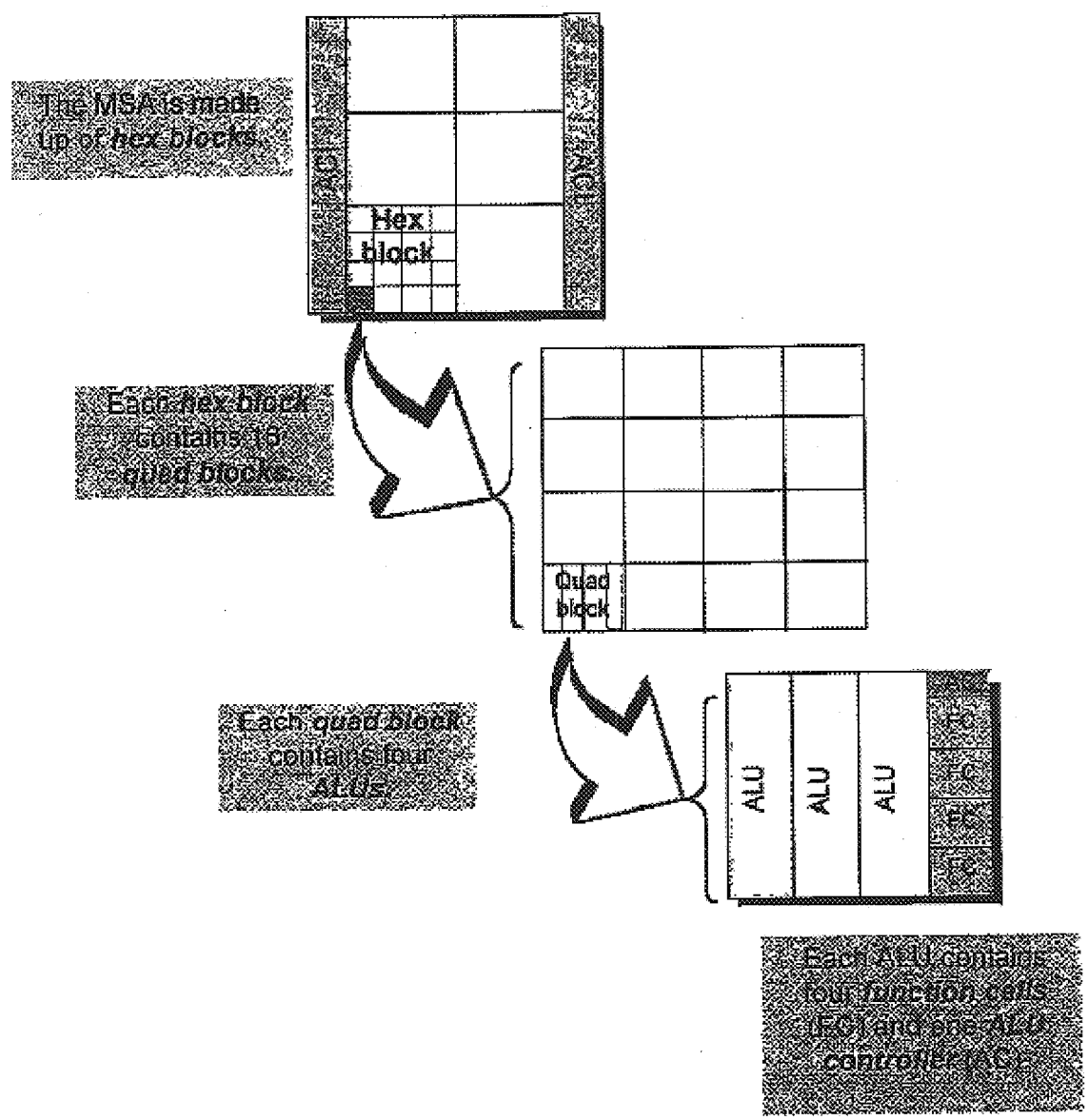
FIG. 8 illustrates the general structure and hierarchy of the PLC hard macro in accordance with an example of the invention.

FIG. 8 illustrates the general structure and hierarchy of the PLC hard macro. As shown in FIG. 8, the MSA is made up of hex-blocks, the smallest geometric region used to construct larger arrays. Within each hex block is 16 quad blocks. Each quad block has four ALUs. Each ALU contains four function cells and an ALU controller. Vertically adjacent ALUs can be combined to form larger ALUs, including full Carry Look-Ahead (CLA) logic for the highest speed arithmetic operations and Logic Joining circuitry for complex logic and control applications. Each column in the array includes a Column Controller block that distributes the global clocks and reset signals to the column. This global clock and reset control is in addition to the clock and reset control in each ALU. An example implementation of the MSA is described in more detail in the co-pending application.

Figure 9:
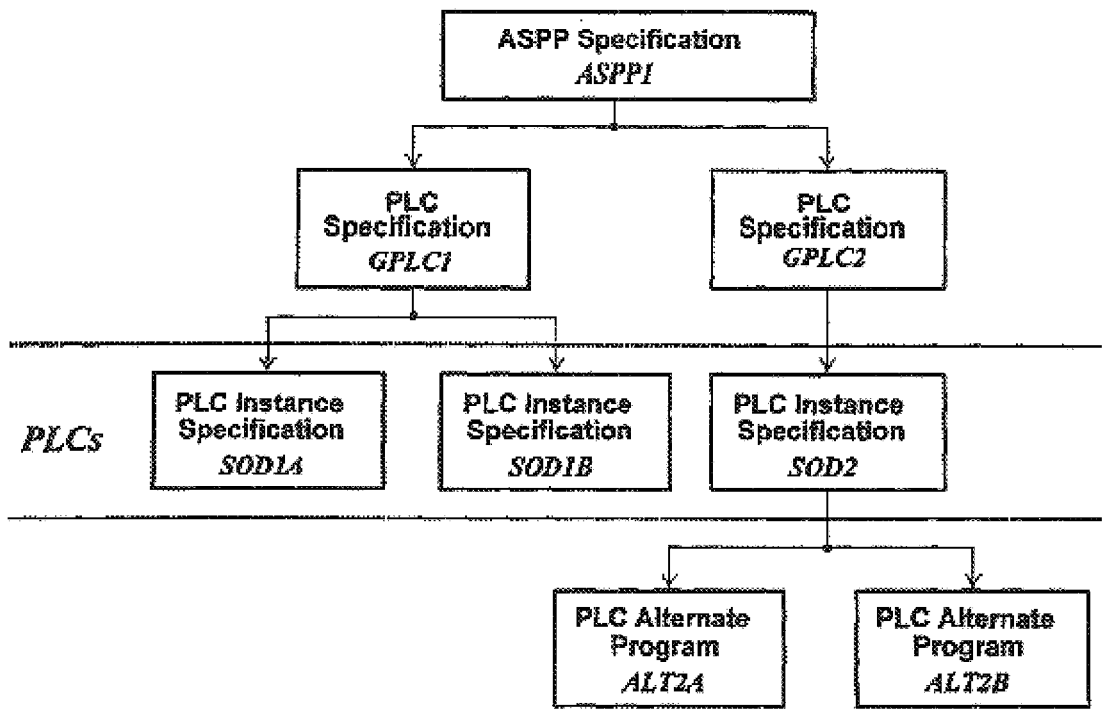
FIG. 9 illustrates an ASPP that uses three distinct PLCs derived from two separate PLC Specifications in accordance with an example of the invention.

An ASPP Specification, a PLC Specification, and a PLC Instance Specification define each application of a PLC. Each of these consists physically of a number of computer files. The relationship of the various specifications is illustrated in FIG. 9, which shows an ASPP that uses three distinct PLCs derived from two separate PLC Specifications.

The ASPP specification identifies each PLC block to be used in an ASIC. It includes information on the number of configuration data sources and the order that each PLC is to be configured in a chain of PLC blocks. This information is used by software to construct composite configuration data files for ROM loading. Typically, a new ASPP design can use PLCs from previous designs without modifying the PLC Specification, but the new design must have a new ASPP Specification and new PLC Instance Specifications for each PLC.

The PLC specification is used by tools to create the physical design database for a PLC. Each PLC has only one PLC Specification.

The PLC Instance Specification is used by tools to create configuration data for use in each PLC in the target ASPP. This specification includes the PLC program for the sign-off design, as will be described in more detail below. Each, instance of a PLC must have a separate PLC Instance Specification. For example, the PLC labeled "GPLC1" in FIG. 9 has two distinct instances in the ASPP, each with a separate sign-off design specification. Only one PLC Instance Specification is used for manufacturing release. Post-production variations of the PLC program for a specific application must conform to the timing constraints and physical interface of the PLC Instance Specification, which in turn must conform to the PLC Specification.

These specifications form the entire source of information needed for the creation of PLCS, the integration of specific instances in an ASPP design, and the configuration data files for those instances. Each specification includes a summary "info style" file with basic data and links to files that are needed to complete the specification. There are three types of files, as described in more detail below.

ASPPSpec: Summary file for the ASPP Specification. Includes a reference to each PLC block in the ASPP, a link to the PLC specifications to be in integration, and a link to the sign-off design specification for each PLC. Also the number and type of configuration data sources and the configuration order for each configuration chain. More particularly, this information contains: The number of PLC configuration chains in the ASPP (each chain has one configuration data source and each chain supports a limited number of PLC Instances); General information for each PLC Instance in the ASPP including a unique identifier and reference to the identifier of the PLC that the instance is based upon; Configuration order; definition of the order in which each PLC Instance in a chain is to be loaded.

PLCSpec: Summary file for a PLC specification. It includes data for the size of PLC, the type of configuration data interface, details of the manufacturing test interface, and links to the ACI specifications. Includes parameter selection for layout variations. More particularly, this information contains: Array height as measured by the number of hex blocks; Array width as measured by the number of hex blocks; ACI definition for each port, including Port type (input, output), Port name, Physical port connection; Reference to simulation models; Reference to timing library; Reference to synthesis constraints for the adapter; Test configurations; An adapter to a source of configuration data.

InstSpec: Summary file for a PLC instance specification. The sign-off design specification includes a listing of the actual ports of a PLC to be used in an instance, a reference to the timing constraint files for the actual interface, and reference to the PLC program source file(s) that make up the sign-off design. To alter the PLC Instance specification to reflect field changes or product variations, create a PLC Alternate Program Specification. More particularly, this information contains: Reference to the Sign-Off Design Verilog source; Signal name map; Reference to the timing constraint definition; Nominal application clock rates and average duty cycle for MSA registers; ACI connections (optional net names).

Specification tree validation is used to validate the completeness of entries in each summary specification file needed for a complete ASPP. The spec validation program is capable of testing each file separately or can be used recursively to test an entire hierarchy from an "ASPPSpec." The program creates a number of intermediate format files as needed by tools during the development of an ASPP and for PLC program modifications by the end customer. In one example, the specification files will be prepared using a combination of text editors and spreadsheet programs.

Figure 10:
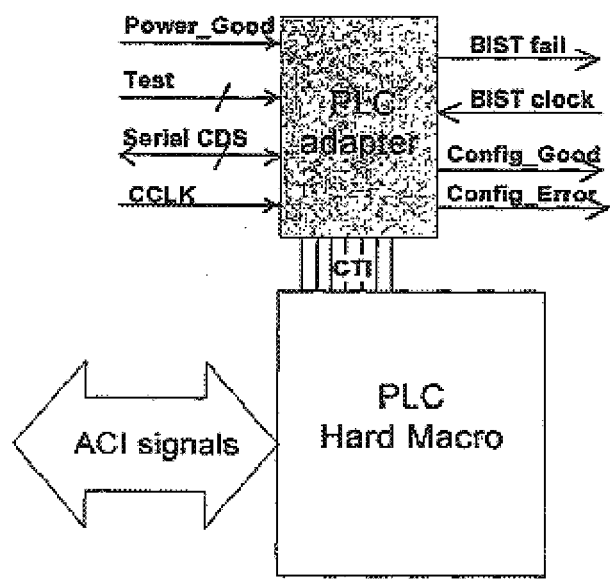
FIG. 10 illustrates an example of the simplified interface for a PLC in accordance with the invention.

An example of the simplified interface for a PLC is shown in FIG. 10. As shown in this example, ACI signals include: MSA inputs, MSA outputs, SCLK1 and SCLK2, SRST1 and SRST2.

The function of each group of interface signals is as follows. Power Good: This power-up signal is generated on-chip or off-chip, and indicates that the power rails are at stable values and that normal logic operations can commence. Test: This group of signals represents the interface for the boundary scan circuitry in the PLC adapter and includes both data and sequential control signals. These signals are normally used for manufacturing component test, but can also be used in some circumstances as a supplementary configuration data source and an interactive (debugger) test interface. The boundary scan controller initiates the self-test circuits in the PLC adapter and is also used to read the summary test results. BIST_fail: This is a dynamic signal during BIST which goes from low to high at the point where the first BIST error is detected. BIST_ clock: This is the clock source for the BIST Engine. Serial CDS: This group of signals represent the Configuration Data Source. For serial ROM interface, the CDS signals can be connected to a set of package pins that are connected in turn to a serial ROM device on the end customer's board design. CCLK: This is the configuration clock input to the PLC. The frequency is typically based on the operating frequency of a serial ROM used to program the PLC. Config Good: The PLC adapter generates this signal to indicate that the configuration process is complete and that normal circuit operation can commence. Config Error: This signal is generated to indicate that some type of problem occurred in the process of configuring a PLC. ACI: The Application Circuit Interface is the collection of application specific input, output, clock and reset signals between the application circuitry and a PLC. SCLK and SRST are the application clock and reset signals for execution of a PLC program in a PLC instance. The PLC adapter inhibits the use of these signals until the configuration process is complete. These are part of the ACI bus. CTI: Configuration/Test Interface. This is the interface between the PLC adapter and the PLC Hard Macro. Signals in this interface include configuration address and data, configuration control, ACI scan chains, and BIST control.

The PLC adapter performs four main functions: Manages the boundary scan test interface—For manufacturing test, the test circuitry interfaces between external TAP controller and PLC scan chains. Also performs the MSA BIST; Performs built-in self-test—This part of the PLC adapter is called the BIST Engine; Initiates and controls the configuration of the MSA; PLC will have an IDDTN pin; Controls the application clock and reset signals.

Figure 11:
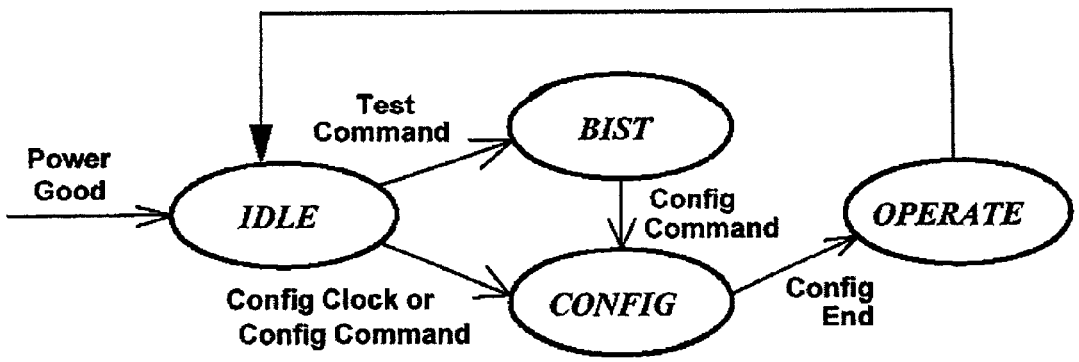
FIG. 11 illustrates an example of the major sates of the PLC adapter according to one implementation of the invention.

An example of the major sates of the PLC adapter according to one implementation is shown in FIG. 11. As shown, the PLC adapter performs no operations until the "power good" signal is asserted and enters an IDLE state.

For the manufacturing test process, the PLC adapter will enter the self-test "BIST" state upon receipt of the appropriate test command. A command can also be used to force the PLC adapter to enter the "CONFIG" state. For normal end use, the PLC adapter enters the "CONFIG" state after power up as soon as a configuration clock is received. After completion of the configuration process, the PLC adapter enters the "OPERATE" state at which time the normal application clocks control the sequence of operations of the MSA.

In one example, the maximum operating frequency of the test interface is 10 MHz. The test functions that can be invoked include the following: MSA force—Disconnects the MSA from the ACI signals. This ability, shared by programming logic and BIST logic in the adapter, allows the ACI application circuit outputs to be forced to all "1s" and the inputs from the application circuits to be ignored. This state allows the MSA to be fully tested using the BIST circuit; ACI scan—Allows the values of signals that are normally MSA outputs to be set for testing the application circuitry outside of the PLC. This uses the test system as a means of loading and updating the values. This also allows sampling signals that are normally MSA inputs; MSA debug—Disconnects the MSA from the ACI signals and allows scan access to the MSA global routing structure; Begin self test—Enables the PLC BIST operations; Read BIST result—Inserts the results of the BIST into the scan path sequence. Operational control—Includes clock control, reset control, the ability to read and write MSA registers and so forth. The operational controls for a specific PLC instance can be limited by aspects of the boundary scan mechanisms external to the PLC; Program Verify—The test circuitry can load a configuration stream (PLC Stream) to program or verify a PLC instance.

Preferably, the PLC adapter supports the use of off-the-shelf serial ROM devices to supply the configuration data that defines the behavior of the MSA. The configuration data source (CDS) interface uses a 4-pin signal interface to an external serial ROM device, including a configuration clock source. The clock source is typically derived from the ASPP system clock (or one of the application clocks SCLK1 or SCLK2).

The number of configuration bits for each PLC depends on the array size. For example, a value of 45,000 bits per hex block can be used for planning purposes. Several PLC instances can be chained together and use the same configuration data source ROM device and interface. The serial ROM interface complies with industry-standard serial configuration PROMs. The CDS interface supports the reading of the PROM. The interface pins are described below: DATA—Data Input from the serial ROM used to initialize the configuration state machine and to load the PLC configuration data storage; RESET/OE—This output is used to reset the serial ROM address counter. Also when reset is active, the Data output is tri-stated. When reset is not asserted, the ROM is ready for reading; CE—When high, the DATA output is tri-stated, the address counter is disabled and the ROM is in a low power state; CLK—Each rising edge increments the ROM address counter, and depending on the other signals, the contents of the incremented address win appear on DATA. This signal can operate up to 15 MHz and requires a physical interface of up to 3.3 V DC.

Figure 12:
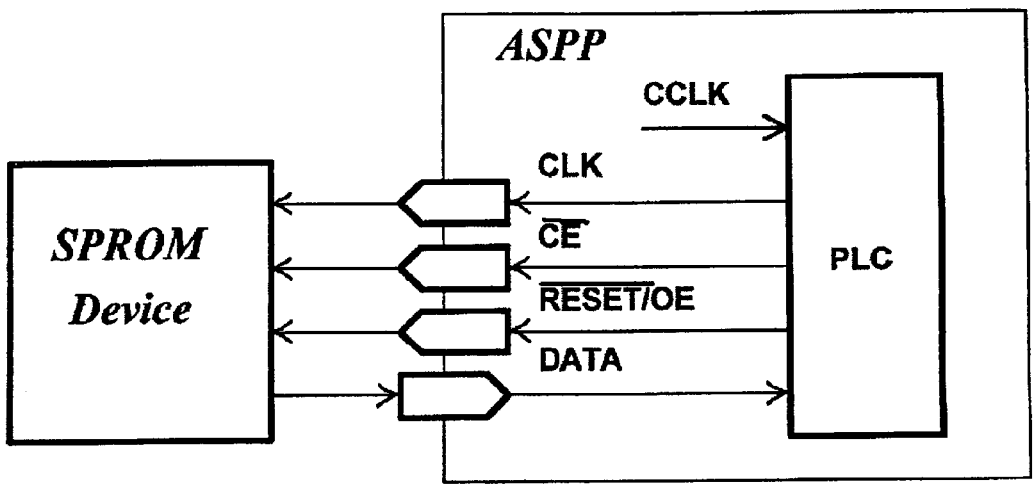
FIG. 12 demonstrates the simplest use of the CDS interface in an example implementation of the invention where there is one PLC instance and the configuration data source is a serial PROM connected to the four basic interface signals.

FIG. 12 demonstrates the simplest use of the CDS interface. There is one PLC instance and the configuration data source is a serial PROM connected to the four basic interface signals. The CDS interface can support up to four PLC instances. The interface also supports cascading of multiple serial PROMs for storing configuration data for multiple PLC instances. The source of the configuration clock is an internal signal called CCLK that is generated in other circuitry in the ASPP.

Two system-level application clock inputs (SCLK1 and SCLK2) are the source of synchronous behavior within the MSA. This allows two "clock domains" within the MSA that may or may not be synchronous relative to each other. For example, one part of the PLC program can interface with an off-chip data source that uses timing independent of another block in the ASPP. In each domain, all ACI signals are assumed to be synchronous with the clock that controls that portion of the PLC program. The network for each application clock will be designed to have deterministic delay and minimum skew throughout the array. Two system-level application asynchronous reset signals (SRST1 and SRST2) are also provided. Typically, SRST1 is paired with the SCLK1 domain and SRST2 is paired with SCLK2, but other combinations are allowed.

The primary function of BIST is manufacturing test of PLCs. The PLC BIST engine methodically tests the validity of all function blocks and routing resources within the MSA. This includes exhaustive tests of each programmable routing resource, every truth table entry of the function cells and ALU controller blocks, and a complete test of the configuration memory. The BIST circuit test coverage should be consistent with industry standards. The PLC BIST result register includes a summary of pass/fails and can be used to deduce failed circuits.

For diagnostic work, the BIST can be interrogated at the point of failure to determine the components of the MSA under test, and therefore those that failed. The test interface, using BIST-like commands, will allow additional manual test functions to narrow down the cause of a test fault.

The BIST control register is used to execute BIST commands from the external TAP. The register writes control signals but reads the BIST CRC value for review. The BIST system takes control of the MSA on the BIST_Sample/Preload UpdateDR rising edge when the execute bit is set. This will also drive the ACI_force signal making all MSA outputs 1.

The Application Circuit Interface (ACI) consists of a set of buffer and test circuitry that: Provides the interface between the MSA and the application circuitry; Provides isolation of the MSA from the application circuitry during PLC BIST; Provides scan support for manufacturing test of the application circuitry.

The ACI structure supports two independent scan chains: the Test Chain, used for manufacturing test of the application circuitry; and the Debug Chain, used for MSA diagnostic and debugging functions. Both scan chains are accessible from the PLC adapter test circuitry. The test chain can be used to capture and stimulate the application circuit signals from the ACI, and is used to isolate the MSA from the ACI during configuration. The debug chain can be used to capture and stimulate signals in the MSA global routing structure independent of the application circuit.

Figure 13:
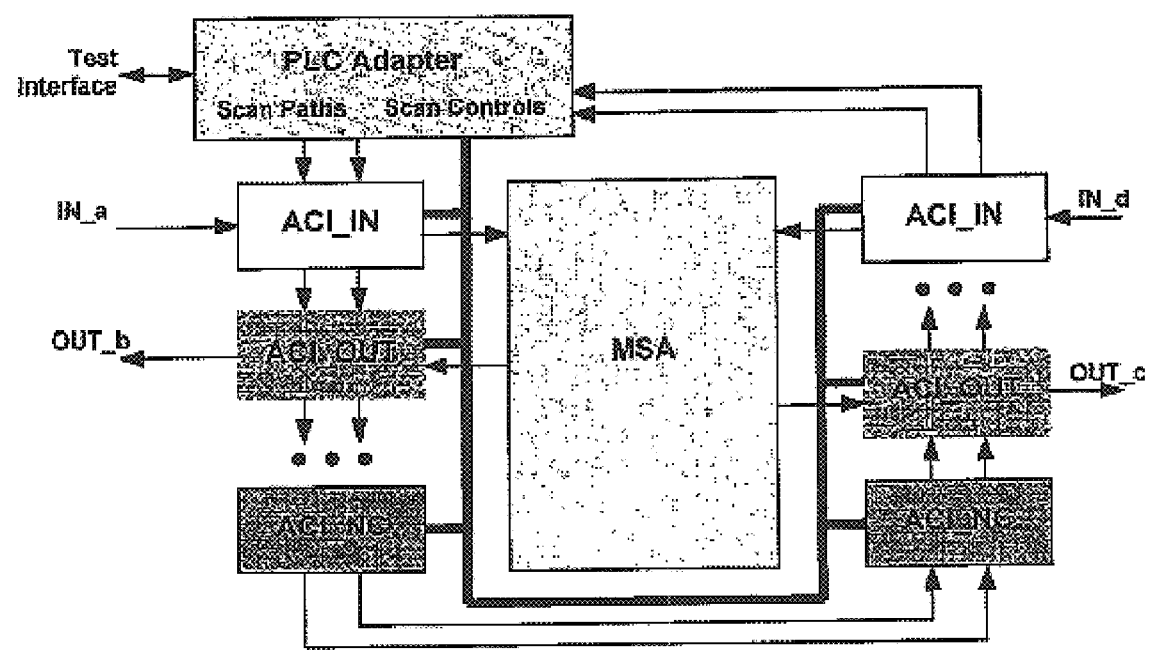
FIG. 13 illustrates an example implementation of the ACI block structure according to the invention.

An example implementation of the ACI block structure is shown in FIG. 13. As shown in FIG. 13, each function cell row of the MSA is connected to four ACI sites on the left and right edges of the array. Each of the ACI sites must contain one of three possible cells: ACI_IN, which connects an input signal from the application circuitry to the MSA; ACI_OUT, which connects an output signal from the MSA to the application circuitry; ACI_NC, which does not connect to the application circuitry, but does provide a continuation of the scan chains.

The assignment of cell type to each ACI site is specified in the PLC Specification. In addition to the application signal interface, the ACI block also contains the input buffers and scan registers for the SCLK and SRST inputs to the PLC.

FIG. 13 further illustrates the basic structure of the ACI logic. The "scan controls" from the boundary scan controller in the PLC adapter buffer are used to shift the scan path data through each ACI signal buffer and set test values. Each ACI signal buffer includes two storage elements: a boundary scan register bit and an interface line value register bit.

In accordance with an aspect of the invention, the PLC technology is designed to integrate easily with a standard ASIC design flow. Design planning, capture and validation are supported through a variety of simulation models, netlisters, and performance and area estimation tools.

Figure 14:
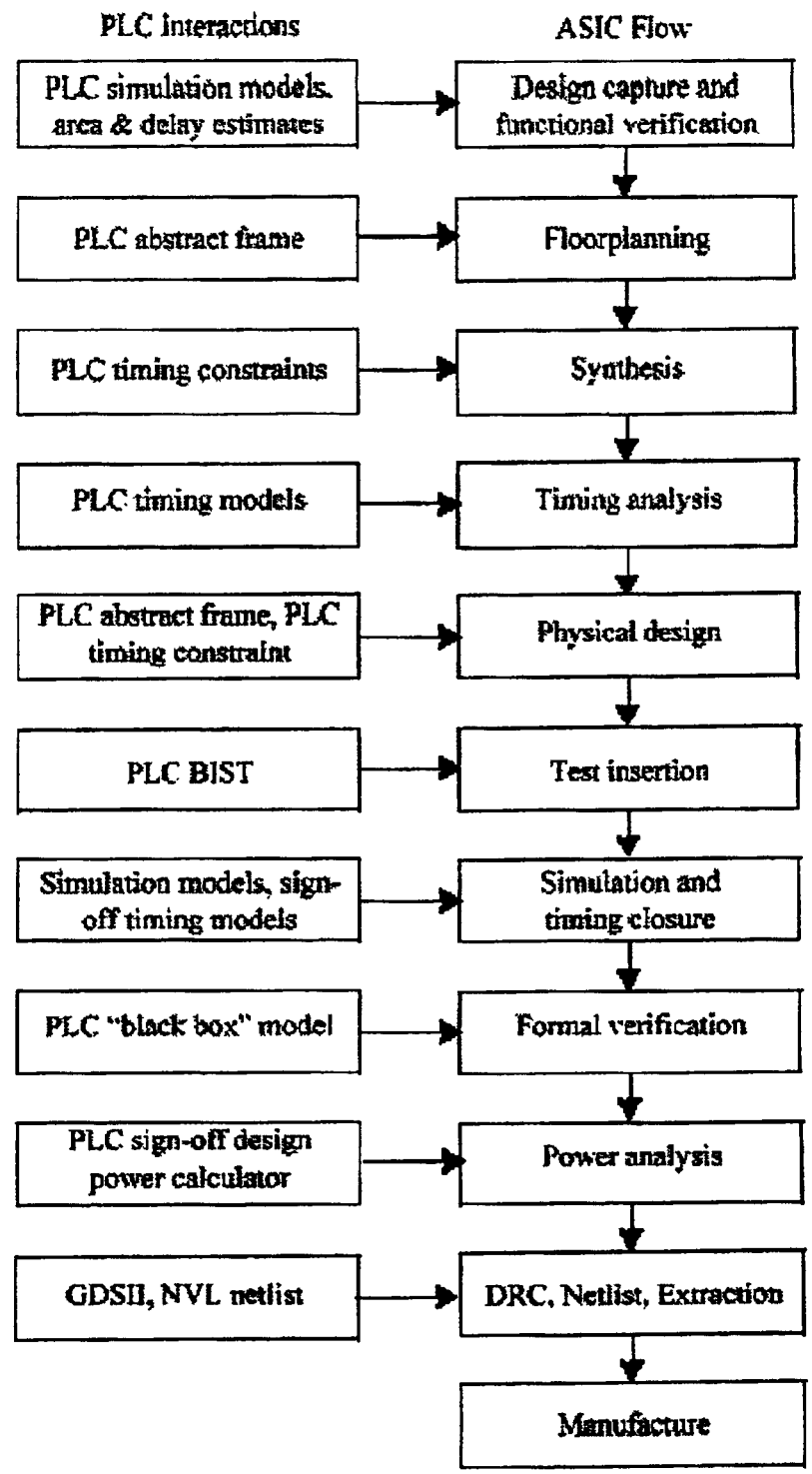
FIG. 14 is a simplified representation of the major steps in a standard ASIC design flow in the context of PLC integration in accordance with an aspect of the invention.

FIG. 14 is a simplified representation of the major steps in a standard ASIC design flow in the context of PLC integration in accordance with an aspect of the invention. Beside each major step appears the PLC technology that interacts with that step. Each of these interactions is described below in turn.

The PLC tools support both behavioral and "gate-level" (function cell) simulation of the entire ASPP, including the customer's PLC programs. System-level simulation is achieved through the use of behavioral wrappers that include models of the PLC adapter and the ACI. Standard behavioral HDL models of a PLC program can be incorporated into the behavioral wrappers to provide a complete system-level model of a PLC application.

Gate-level simulation is supported through the use of detailed functional models of the PLC resources. The PLC netlister, plcNet, generates a structural Verilog netlist of detailed PLC primitive models that can be incorporated into a system-level model for simulation.

Back annotation of delay information into the structural simulation is done with the PLC delay calculator, plcDelay. Delay information is given in the form of SDF annotations to the Verilog netlist. For planning purposes, the PLC programming tools also provide early estimates of cell utilization and performance of PLC programs.

A PLC enters the physical design process with a hard macro, the MSA and ACI, and a soft macro, the PLC adapter. The hard macro consists of an abstract frame, a timing model, and a layout database. Chip-level floorplanning is supported through the use of the abstract frame representation.

In one example of the invention, the PLC tools support Synopsys Design Compiler for synthesis of both ASIC circuitry and PLC programs. Constraints are passed to these tools along with circuitry described in either Verilog or VHDL RTL. The constraints are developed by the customer as part of the PLC instance specification. Timing constraints can be provided in Synopsys Design Constraint (SDC) format. The development of timing constraints is supported by the PLC delay calculator, which provides timing information for a sign-off design.

Preferably, synthesis of PLC programs is supported through a Design Compiler technology library and DesignWare component library.

Figure 15:
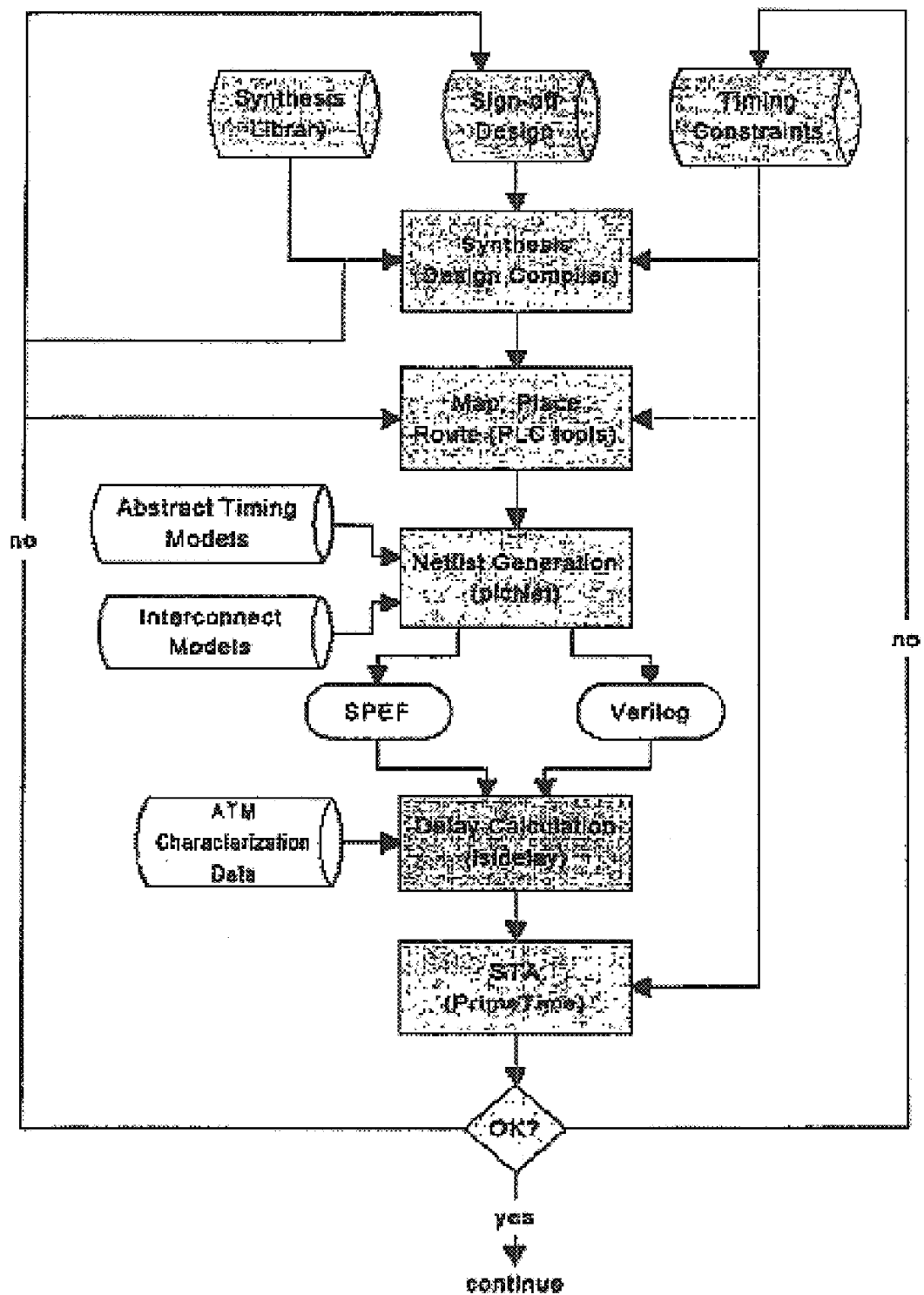
FIG. 15 illustrates the pre-silicon timing closure flow in accordance with one example of the invention.

The pre-silicon timing closure flow in accordance with one example of the invention is shown in FIG. 15. Pre-silicon timing analysis and ASIC timing closure is facilitated by the use of the PLC Timing Contract and one or more Sign-Off Designs. The Timing Contract, developed by the ASIC designer, establishes a set of constraints between the PLC instance and the rest of the ASPP. These constraints, expressed in Synopsys Design Constraint (SDC) format, control the synthesis and physical design of the application specific circuitry that interfaces to the PLC, and establish constraints on the behavior of all subsequent programs to be mapped to the PLC instance.

The Sign-Off Design is an example PLC program that demonstrates that the constraints of the Timing Contract can be satisfied by a program mapped to the instance. The Sign-Off Design is synthesized using Synopsys Design Compiler with the PLC synthesis library and constrained by the timing constraints. The resulting netlist is input to the PLC map, place and route flow. Before committing to silicon, the PLC program used as the sign-off design must meet the timing constraints, but there may be some room for modification. Any PLC program created post-silicon must do more than meet timing constraints, it must adhere strictly to the Timing Contract. The timing contract information, as represented by the sign-off design, is used for timing-driven place and route.

More than one sign-off design can be used for any given application in the pre-silicon flow. These designs can be used to test min-max or other conditions deemed important. However, the sign-off designs still must meet the previously specified timing contract or serve as input to modify the timing contract.

Pre-silicon timing analysis of a PLC instance in an ASIC device is based upon a set of Abstract Timing Models, or ATMs. These models are fully characterized gate-level circuits, but are "abstract" in that they do not necessarily reflect the actual silicon structures. Rather, the ATMs reflect the behavior of the PLC circuitry under a given configuration. Given a Sign-Off Design (or any other PLC program), plcNet may be used to generate a structural netlist in terms of ATM primitives. The ATM netlist is then input to the standard ASIC timing flow.

For each programmable structure in the PLC, there is a set of ATMS, with each ATM exhibiting the behavior of the circuit under a different configuration. For example, the A input mux of the function cell may be represented by a set of sixteen modules, one for each input source. The netlister, plcNet, will instantiate the module that corresponds to the input source as specified by the configuration. Unconfigured resources either do not appear in the netlist, or appear as passive loads. The resulting netlist, therefore, is an abstract circuit representation of the programmed configuration. However, each device that plays a role in the timing behavior of the program is accurately modeled.

In addition to the ATM netlist, plcNet is also used to generate a model of the interconnect between the gates of the ATM netlist. Operating in this mode, plcNet reads a database of the extracted parasitics for the entire PLC as well as the placed and routed Sign-Off Design, and generates an output file with parasitic resistance and capacitance, in SPEF DNET form, for each node in the corresponding ATM netlist.

The parasitic database read by plcNet will be produced in SPEF form by the Mentor XCalibre extraction tool. The SPEF produced by plcNet conforms to IEEE Std. 1481. The ATM netlist, the SPEF interconnect model and the fully characterized ATM cells constitute an ASIC gate model whose timing behavior is equivalent to the PLC as configured by the Sign-Off Design. This model is then analyzed by the standard ASIC delay calculator (such as 1sidelay) and Synopsys PrimeTime static timing analyzer to achieve timing closure.

Figure 16:
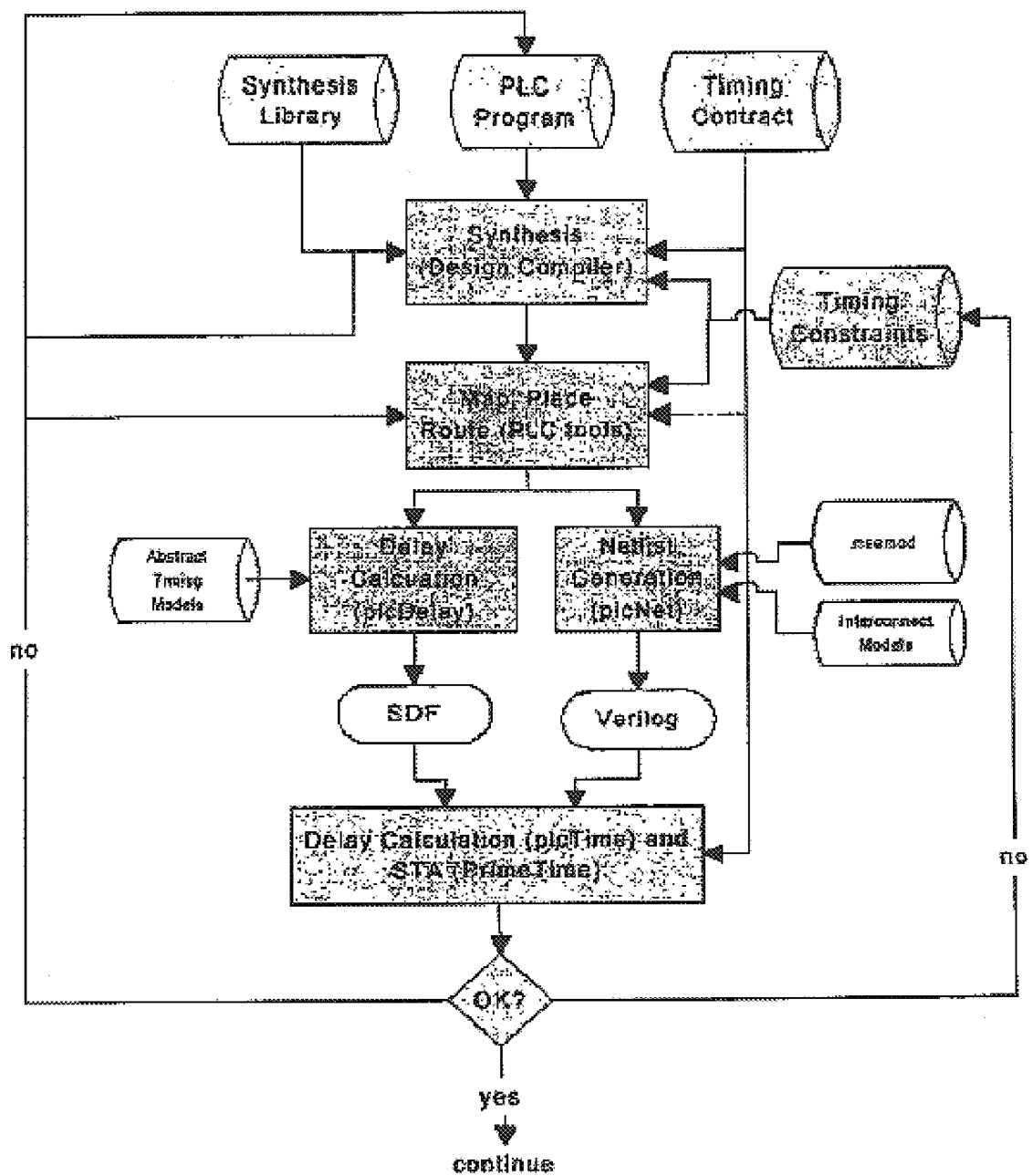
FIG. 16 illustrates an example of the post-silicon timing closure flow according to the invention.

An example of the post-silicon timing flow according to the invention is shown in FIG. 16. The Timing Contract developed during ASIC design is used to constrain synthesis of the PLC program and control timing-driven place and route. Additional constraints and timing exceptions may be added during synthesis and timing closure, but the Timing Contract constraints must be held constant. The timing contract can be seen as an immutable, inflexible timing constraint to which all post-silicon PLC programs must adhere. By contrast, timing constraints used pre-silicon (and possibly added post-silicon as well) are subject to some negotiation.

The PLC delay calculator, plcDelay, produces SDF annotations for the netlists produced by plcNet, accounting for the internal PLC routing delays and function cell delays. The timing behavior of the annotated Verilog netlist can then be checked against the constraints of the timing contract by plcTime, or a third party static timing analyzer such as Synopsys PrimeTime.

The plcDelay tool reads a database of delay information for each arc through the MSA function cell, the ALU controller, and through the various routing resources, and computes path delays for a given configuration. The path delays are written out as SDF annotations on either an ATM netlist or a netlist produced by plcNet. The timing model employed by plcDelay is independent of the input ramps and output loads seen by the ACI block. It is assumed these static effects of the ASIC environment are encapsulated in the constraints of the Timing Contract.

The plcTime tool is a simple critical path finder and static timing analyzer that uses the netlist and delay information produced by plcNet and plcDelay to verify the placed and routed PLC program satisfies the constraints of the Timing Contract.

The delay models used by plcDelay are derived by characterizing the transistor level circuits plus the extracted parasitics using SPICE. The characterization is done at three process corners: Nominal process, nominal voltage, nominal temperature; Slow process, worst-case voltage, and worst-case temperature; Fast process, best-case voltage, and best-case temperature. These models will be correlated against the ASIC design flow by identifying a set of configured paths through the MSA and for each path, computing the path delay using both plcDelay and the ASIC delay calculator. The input to the ASIC flow will be the netlist and SPEF database produced by plcNet.

Full chip simulation is supported through the use of gate-level models of the PLC adapter and the ACI, and the function cell level models of the PLC sign-off design. Together these three components constitute a complete simulation model of the PLC instance. An SDF file containing delay information for the sign-off design is generated by the PLC delay calculator. Separate SDF files are provided to back annotate the PLC adapter and ACI. The PLC simulation libraries and netlister support Cadence Verilog-XL and NC-Verilog, Synopsys VCS, and Mentor Modelsim simulators through Verilog (IEEE 1364).

As set forth above, the design information loaded into a PLC so that it can perform a particular function is called a PLC program. PLC programs are typically developed both during the ASIC development process (e.g. the sign-off design) and after the ASIC has been fabricated.

In one example implementation, the PLC tools are designed around a 32-bit operating system architecture, for example a Sun SPARC architecture running Solaris 7. Further, the PLC tools preferably use scripting languages to customize the PLC programming flow and ease the integration into existing tool environments. Each of the PLC tools thus has a simple command line interface in which input files, output files and parameters are specified by command line options.

The PLC tool set preferably uses a common intermediate file format called PLIF to convey PLC design information from one tool to another. PLIF is an ASCII representation of the configuration of a PLC array. PLIF is designed to be both machine and human readable and modifiable. PLIF captures a variety of information about a PLC program at several stages of the development process. PLIF supports the representation of: Placement—Any of the resources in a program can be unplaced, placed at absolute locations within the array, or positioned with a relative offset from a given location or resource. Module generators create relocatable clusters of relatively placed resources; Hierarchy—Programs can be hierarchical or flattened. Multiple levels of the hierarchy can reside in a single PLIF file, or in separate files. Modules can be instantiated from libraries of components; Routing—Any of the signal nets in a program can be unrouted, partially routed or fully routed through physical routing resources. Where possible, net names from the original RTL are preserved; Directives—Attributes and directives can be passed from one tool to another through the use of PLIF properties.

Figure 17:
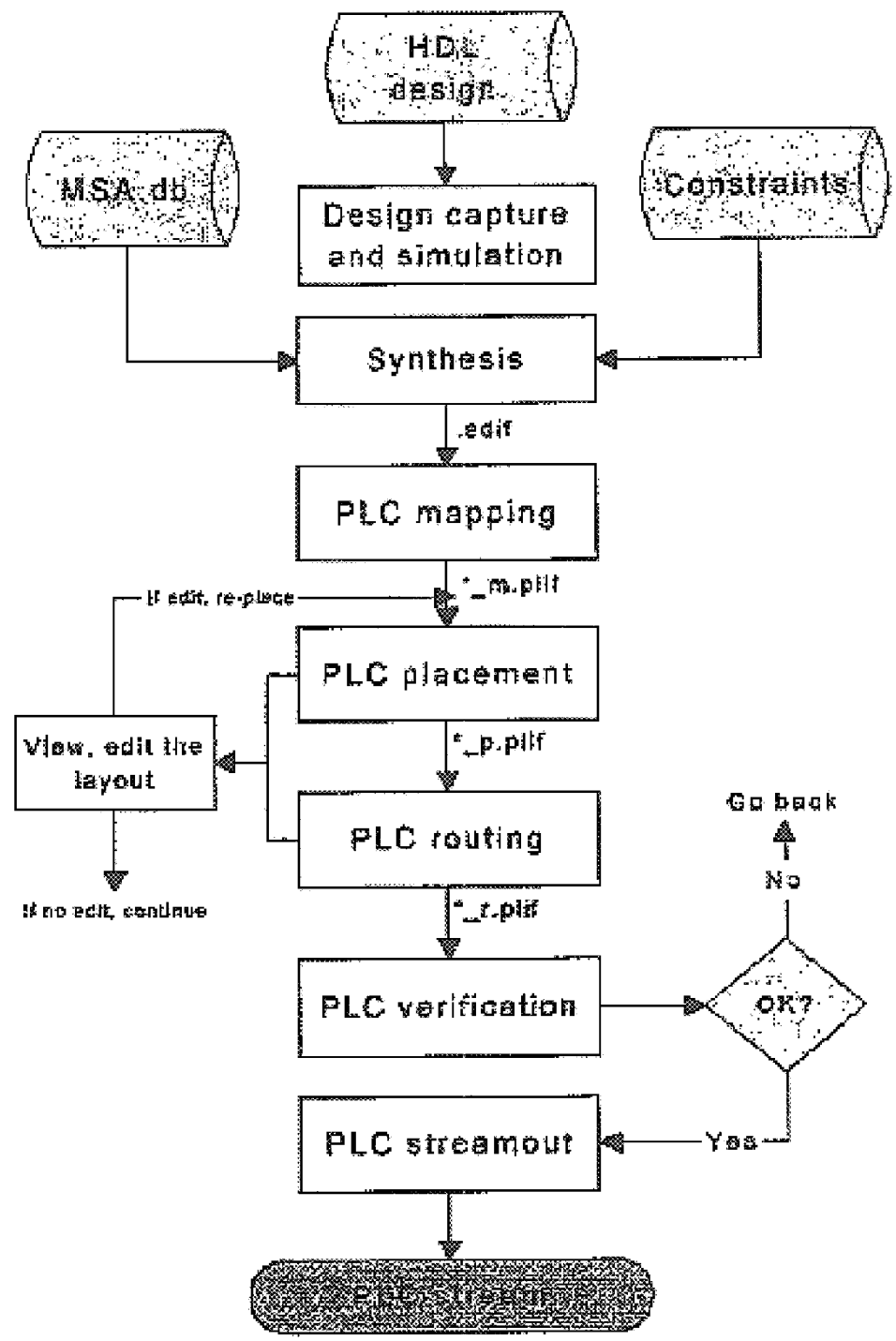
FIG. 17 illustrates an example of the PLC programming flow according to the principles of the invention.

An example of the PLC programming flow according to the principles of the invention is shown in FIG. 17. The specific inputs to each step in the flow can be found in the appropriate user documentation.

As shown in FIG. 17, the programming task begins with traditional design capture and validation techniques.

Typically, this is Verilog RTL, although both VHDL and schematic capture are possible through standard interfaces provided with the synthesis tools. Design capture is supported through the use of netlisters and simulation models.

The PLC design environment includes the PLC Generator Library, a set of parameterizable module generators that can be invoked by operator inference from logic synthesis or by direct structural instantiation. These modules include Verilog simulation models and highly optimized physical designs. Behavioral simulation is supported for both the PLC program alone and, when coupled with the simulation models of the PLC adapter and ACI blocks, for the PLC integrated with the rest of the system.

The PLC design tools preferably include parameterized Verilog HDL models of the PLC adapter and ACI. Models for a PLC instance are created from the PLC instance specification. The interface models together act as a set of behavioral wrappers; register transfer level HDL code that provides a model of the interface between the MSA and PLC adapter. The behavioral wrappers permit the simulation of behavioral (pre-synthesis) models of PLC designs. The PLC interface models and behavioral wrappers will be provided in Verilog RTL form.

The PLC tool set includes detailed functional simulation models of the PLC resources, called MSAMOD. Each primitive model accepts the symbolic configuration data characterizing the behavior of the particular component as a parameter. The component accurately models the behavior of the physical resource under the given configuration. The functional models support back annotation of SDF delay information.

The PLC netlister, plcNet, will convert a PLIF program into a structural Verilog form in which the primitives are instances from the MSAMOD library, which provided in encrypted Verilog form.

Once a PLC program has been shown to be functionally correct, the design can be synthesized using third-party synthesis tools, subject to timing constraints established in the ASIC design flow.

Once the PLC program has been functionally verified through behavioral/RTL simulation, the Verilog code is synthesized using third-party logic synthesis tools. One example of the PLC tool set supports Synopsys Design Compiler by providing a technology-specific cell library and a DesignWare component library tailored to the PLC. Logic synthesis is controlled by timing constraints specified by the ASIC designer in the PLC instance specification.

A technology library is preferably provided to allow the Synopsys Design Compiler to synthesize logic to a form which can be processed by the PLC tool set. This library will be optimized to perform efficient mapping of logic into PLC supported gate structures.

A Synopsys DesignWare component library is also preferably provided to perform efficient mapping of RTL constructs into instances of parameterized module generators. The output of Design Compiler will be a netlist in EDIF 200 form.

The ACI port timing information provided in the PLC instance specification is used to generate a set of synthesis constraints for export to Synopsys Design Compiler. Constraints should be in Synopsys Design Constraint (SDC) format.

The technology mapping tool, plcmap, maps an EDIF 200 netlist into PLIF form for subsequent processing by the PLC tools. The plcmap command performs a variety of optimizations on the netlist to take advantage of the unique MSA architecture. For example, register cells and combinational logic can be combined into MSA function cells, and arithmetic structures can be mapped to MSA ALUs.

The module generation capability will automatically generate highly optimized PLC designs from instantiations of user definable parameterized modules. The module generation capability can be available as a stand-alone tool, or as a function embedded within plcMap so as to operate effectively and invisibly to the user. It will read the EDIF 200 netlist produced by the third party synthesis tool, extract the module instantiations and parameters, and generate macro cells in PLIF form. The module generation supports DesignWare Basic elements The output of logic synthesis is an EDIF netlist of logic cell primitives and instances of parameterized modules. Mapping this netlist onto the programmable structures of the PLC is fully automated by the PLC tools. The first step maps the gate-level description into PLC structures using a set of proprietary algorithms. Mapping logic gates to PLC structures also gives area and delay estimates for the PLC program.

During mapping or placement, the user specifies the array dimensions. The default dimension for the MSA99 architecture is 4×4 hex blocks. The dimension is specified as a command-line option when invoking plcMap or plcPlace. For example, to specify a 2×2 hex MSA, the user would enter the following on the command line: % plcmap—input file.edif—output file_m.plif—dimensions 22

The mapped function cells and ALUs, together with any PLC Generator Library instances, are placed and routed in the MSA by timing-driven place and route tools. Although the map, place, and route tools are fully automatic, the user can control the process through the use of various optimization parameters and directives. A PLC placement editor allows the user to make specific initial placements manually to constrain the programming flow. The result of the physical design process can be viewed graphically with the PLC viewer.

The PLC placement tool, plcPlace, reads an unplaced or partially placed PLIF design together with the PLC array I/O database generated from the PLC instance specification to produce a placed PLIF design. The user interface supports several mechanisms to control the placement. For example, the user can trade off placer run time for quality and density of placement and select from multiple placement algorithms and optimization techniques and parameters.

The plcPlace tool includes both routability and timing-driven placement algorithms. The routability-driven algorithm maximizes the routability of the final placement by placing the design according to the constraints of the array. In addition to considering routability, the timing-driven algorithm attempts to minimize routing distance, and therefore delay, of timing critical nets. The user can specify the criticality of individual nets by either annotating the PLIF design file, or by supplying the placer with a separate constraint file. Timing constraints can be specified as either target delays or relative priorities on individual nets or groups of nets.

The PLC routing tool, plcRoute, reads a placed, unrouted or partially routed PLIF design together with the array I/O database generated from the PLC instance specification to produce a routed PLIF design. The user interface supports several mechanisms to control the routing. For example, the user can trade off router run time for quality of the resulting route, select from multiple routing algorithms and optimization techniques and parameters, and assign routing priorities to individual nets and groups of nets.

The plcRoute tool includes both routability and timing driven algorithms. The routability driven algorithm minimizes the number of nets unrouted by routing the design according to the constraints of the array. In addition to considering routability, the timing driven algorithm attempts to minimize routing distance, and therefore delay, of timing critical nets. The user can specify the criticality of individual nets by either annotating the PLIF design file, or by supplying the router with a separate constraint file. Timing constraints can be specified as either target delays or relative priorities on individual nets or groups of nets.

The PLC tools preferably include a graphical tool, plcview, for viewing PLC designs. The viewer will read and write designs in PLIF format together with the physical array description generated from the PLC specification. With the viewer, the designer can do the following tasks: Display a map of the full array, indicating the resources that are configured by the PLC design; Pan and zoom across the array; Select array resources and display the configuration information; Display "fightlines" for individual nets and groups of nets; Display actual routes for individual nets and groups of nets;

Additional functionality will be provided to the Viewer to allow for placement editing. This will allow the user to interactively select the placement of specified blocks of pre-mapped functionality onto the array. This step will occur before the automated placement and routing tools take control of the data, and they will use this initial "seed", data to complete configuration of the design. Each revision made with the editor triggers another placement, routing, and verification.

Pre-silicon and post-silicon timing analysis is supported by plcNet, plcDelay and plcTime.

plcNet has three modes of operation. (1) Generate a netlist of MSAMOD primitives. In this mode plcNet may operate on a PLC program at any level of completion (mapped, placed, or routed). The resulting Verilog netlist may be used for functional simulation, or may be annotated with delay estimates for timing simulation. (2) Generate a netlist of ATM primitives. In this mode plcNet typically operates on a fully placed and routed program. The resulting Verilog netlist may be used for gate level simulation or static timing analysis. The netlist may be annotated with delay information, or it may be augmented with a SPEF interconnect databases produced by mode 3. (3) Generate a SPEF interconnect database. In this mode plcNet operates only on a fully placed and routed program. In addition to the design database plcNet also reads a database of extracted parasitic capacitances and resistances. The output is a SPEF file containing interconnect parasitic information for every MSA wire segment used in the PLC program.

Delay calculation for pre-silicon timing estimation and post-silicon timing closure is performed by plcDelay. The input to plcDelay is a PLC program at any level of completion (mapped, placed or routed). The output is SDF annotations to a netlist generated by plcNet. The plcDelay tool operates in one of several modes, depending on the completion state of the input circuit: If the circuit has been mapped but not placed statistical fanout dependent delay models are used to estimate the interconnect delays; If the circuit has been placed but not routed, more accurate models based upon routing distance as well as fanout are used to estimate interconnect delays; If the circuit has been fully placed and routed, actual path delays from the MSA characterization database are used.

In all cases, the function cell and ALU controller delays reported are derived from the MSA characterization database. The output of plcDelay conforms to IEEE Std. 1497 Version 3.0 Standard Delay Format (SDF).

The performance characteristics of the PLC program are computed and reported by the PLC delay calculator, plcdelay. The calculated delay information is used to generate several important databases, including: Timing models suitable for simulation in a third-party simulator. The PLC netlister converts the PLC program into a Verilog language netlist which is annotated with SDF delay information generated by the PLC Delay Calculator; An initial set of timing constraints for the PLC instance. These timing constraints, derived from the sign-off design, can serve as a starting point when developing the timing constraint portion of the PLC instance specification; Timing models suitable for third-party static timing analysis. These models, generated from the sign-off design, can be used in the timing closure of the ASIC design; Post-route delays contributed by interconnect parasitics; Pre-placement, or post-placement and pre-routing interconnect delay estimates Input to a third-party critical path analyzer such as Synopsys PrimeTime or Mentor Velocity will consist of a PLC program converted to Verilog format, a technology dependent delay database.

The PLC timing analyzer, plcTime, is a simple critical path finder and static timing analyzer that uses the netlist and delay information produced by plcNet and plcDelay to verify the placed and routed PLC program satisfies the constraints of the Timing Contract. The output of picTime is a set of reports including: a histogram plotting the number of paths against the path delays; a detailed list of the delays in the top n critical paths; a list of timing contract violations.

The plcTime tool can calculate and report the following information: I/O port to I/O port combinational path delays; I/O port to clock path delays; Clock to clock path delays; Clock to I/O port path delays.

The delay calculator will have the ability to generate Standard Delay Format (SDF) output for back annotation of delays into third party simulators and static timing analyzers. The SDF output can be used in conjunction with the Verilog netlist form of the PLC program and the functional simulation models of the PLC adapter and ACI blocks to provide a complete timing simulation model of the PLC instance.

The annotated Verilog netlist will also be suitable for input to third party static timing analysis tools, such as Synopsys PrimeTime.

The PLC power calculator, plcPwr, estimates the power dissipated by the PLC instance. Customer inputs to plcPwr are the placed and routed sign-off design, a set of target clock frequency, and an estimate of the toggle rates of the MSA resources. Toggle rates can be provided at the function cell level, at the module level, or an average value can be assigned to the entire sign-off design. The output of plcPwr is an average power dissipation that accounts for the internal programmable routing resources as well as the function cells.

The final step in the PLC programming flow is the generation of the configuration data. The stream generator, plcOut, converts the completely routed PLC program into a form suitable for loading into the physical PLCs. It can also merge multiple PLC programs for one or more PLCs into a single configuration data source. The input to the byte stream generator is a set of fully placed and routed PLC designs in PLIF form. The actions taken by the stream generator include: Ordering the PLC streams to match the cascade order of multiple PLCs specified in the ASPP Specification; Inserting appropriate instructions into the stream to control the configuration process; Setting the appropriate configuration bits in the periphery of the MSA to enable and disable used and unused ACI inputs and outputs, based upon the connections in the actual PLC Program; Formatting the configuration data for the appropriate configuration data source (e.g. serial ROM or boundary scan chain); Add appropriate instructions into the byte stream to control SCLK and SRST and other ACI signals during configuration.

The output of the stream generator is a data file consistent with the configuration data source required for a PLC adapter.

The netlist verification tool, plcCheck, will consist of a design constraint checker and a netlist integrity checker. The design constraint checker will verify that a PLC program does not violate any of a set of pre-defined constraints, including: Multiple drivers on the same net; Incompatible configurations for related resources; Multiple incompatible configurations for a single resource; Undriven array outputs; Disconnected array inputs.

The netlist integrity checker will compare the post-placed and routed PLC program against the pre-placed and routed (post-mapping) netlist to ensure the design tools have not changed the topology of the PLC program.

Although the present invention has been described in detail with reference to the preferred embodiments thereof, those skilled in the art will appreciate that various substitutions and modifications can be made to the examples described herein while remaining within the spirit and scope of the invention as defined in the appended claims.

What is claimed is:

1. An integrated circuit, comprising:
   a programmable logic core that supports:
      an idle state that is entered after an assertion of a signal that power is good;
      a built in self test state for testing the programmable logic core, the built in self test state is entered from the idle state upon receipt of a test command;
      a configuration state for implementing a configuration process, the configuration state supports entry from the idle state and from the built in self test state after receipt of a configuration clock signal; and
      an operate state that controls operations of arithmetic logic units, and is entered after completion of the configuration process; and
   application specific circuitry, the application specific circuitry being designed in accordance with a sign-off design.

2. The integrated circuit according to claim 1, wherein the first programmable logic core comprises:
   a programmable multi-scale array comprising a plurality of configurable arithmetic logic units; and
   a programmable logic core adapter that configures the programmable multi-scale array.

3. The integrated circuit according to claim 1, wherein the programmable logic core adapter is configured to receive configuration data and load the configuration data into configuration memory of the programmable logic core adapter.

4. The integrated circuit according to claim 1, wherein the first programmable logic core comprises an application circuit interface that interfaces between the programmable multi-scale array and the application specific circuitry.

5. The integrated circuit according to claim 1, wherein the programmable multi-scale array performs register transfer level functions.

6. The integrated circuit according to claim 1, further comprising a plurality of other programmable logic cores.

7. The integrated circuit according to claim 1, wherein the first programmable logic core includes a programmable logic core control for controlling the programmable logic core.

8. The integrated circuit according to claim 7, wherein the programmable logic core control provides a control mechanism for testing the first programmable logic core.

9. The integrated circuit according to claim 1, further comprising scratchpad memory.

10. An integrated circuit, comprising:
   (I) application specific circuitry, the application specific circuitry being designed in accordance with a sign-off design; and
   (II) a first programmable logic core including at least
      (A) a programmable multi-scale array having an array of configurable arithmetic logic units supporting register transfer level functions, random logic structures, and state machine structures,
      (B) an application circuit interface for providing a signal interface between the programmable multi-scale array and the application specific circuitry, the application circuit interface having test registers for testing the programmable logic core,
      (C) scratchpad memories for supplementing storage of the programmable multi-scale array,
      (D) a configuration test interface for data and control flow between the application specific circuit and the programmable multi-scale array,
      (E) a programmable logic control for loading configuration data into the multi-scale array, and
      (F) a programmable logic core adapter that configures the programmable multi-scale array through the configuration test interface.

11. The integrated circuit according to claim 10, further comprising a configuration data source that stores the configuration data.

12. The integrated circuit according to claim 10, further comprising a plurality of other programmable logic cores.

13. The integrated circuit according to claim 10, wherein the programmable logic core control provides a control mechanism for testing the first programmable logic core.

* * * * *